United States Patent
Perel et al.

(10) Patent No.: US 7,586,109 B2
(45) Date of Patent: *Sep. 8, 2009

(54) TECHNIQUE FOR IMPROVING THE PERFORMANCE AND EXTENDING THE LIFETIME OF AN ION SOURCE WITH GAS DILUTION

(75) Inventors: Alexander S Perel, Danvers, MA (US); Craig R Chaney, Rockport, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 104 days.

This patent is subject to a terminal disclaimer.

(21) Appl. No.: 11/685,348

(22) Filed: Mar. 13, 2007

(65) Prior Publication Data
US 2008/0179545 A1 Jul. 31, 2008

Related U.S. Application Data

(60) Provisional application No. 60/897,411, filed on Jan. 25, 2007.

(51) Int. Cl.
*H01J 37/317* (2006.01)
*H01J 37/08* (2006.01)
*H01J 49/10* (2006.01)

(52) U.S. Cl. .............. 250/492.21; 250/492.2; 250/423 R; 315/111.81

(58) Field of Classification Search ............ 250/492.21, 250/492.2, 423 R; 315/111.81
See application file for complete search history.

(56) References Cited

U.S. PATENT DOCUMENTS

| | | | | |
|---|---|---|---|---|
| 5,962,858 A * | 10/1999 | Gwinn | ................. | 250/492.21 |
| 6,639,223 B2 | 10/2003 | Reyes | | |
| 6,756,600 B2 * | 6/2004 | Ng et al. | ................. | 250/492.21 |
| 2004/0107909 A1 | 6/2004 | Collins et al. | | |
| 2005/0181621 A1 | 8/2005 | Borland et al. | | |
| 2008/0237496 A1 * | 10/2008 | Gupta | ................. | 250/492.21 |

FOREIGN PATENT DOCUMENTS

| | | |
|---|---|---|
| CA | 1227289 A1 | 9/1987 |
| JP | 11354068 A | 12/1999 |

OTHER PUBLICATIONS

V.S. Voitsenya, D.I. Naidenkova, et al.; On the possibility to increase efficiency of conditioning of vacuum surfaces by using a discharge in a hydrogen-noble gas mixture; National Institute for Fusion Science-799, Apr. 2004, pp. 1-13.

* cited by examiner

*Primary Examiner*—Nikita Wells (57) ABSTRACT

A technique improving the performance and extending the lifetime of an ion source with gas dilution is disclosed. In one particular exemplary embodiment, the technique may be realized as a method for improving performance and extending lifetime of an ion source in an ion implanter with gas dilution. The method may comprise releasing a predetermined amount of dopant gas into an ion source chamber, and releasing a predetermined amount of dilutant gas into the ion source chamber. The dilutant gas may comprise a mixture of a xenon-containing gas and a hydrogen-containing gas for diluting the dopant gas to improve the performance and extend the lifetime of the ion source.

21 Claims, 7 Drawing Sheets

TECHNIQUE FOR IMPROVING THE PERFORMANCE AND EXTENDING THE LIFETIME OF AN ION SOURCE WITH GAS DILUTION

CROSS-REFERENCE TO RELATED APPLICATIONS

This patent application claims priority to U.S. Provisional Patent Application No. 60/897,411, filed Jan. 25, 2007, which is hereby incorporated by reference herein in its entirety.

FIELD OF THE DISCLOSURE

The present disclosure relates generally to semiconductor manufacturing equipment and, more particularly, to a technique for improving the performance and extending the lifetime of an ion source with gas dilution.

BACKGROUND OF THE DISCLOSURE

Ion implantation is a process of depositing chemical species into a substrate by direct bombardment of the substrate with energized ions. In semiconductor manufacturing, ion implanters are used primarily for doping processes that alter the type and level of conductivity of target materials. A precise doping profile in an integrated circuit (IC) substrate and its thin-film structure is often crucial for proper IC performance. To achieve a desired doping profile, one or more ion species may be implanted in different doses and at different energy levels.

Figure 1:
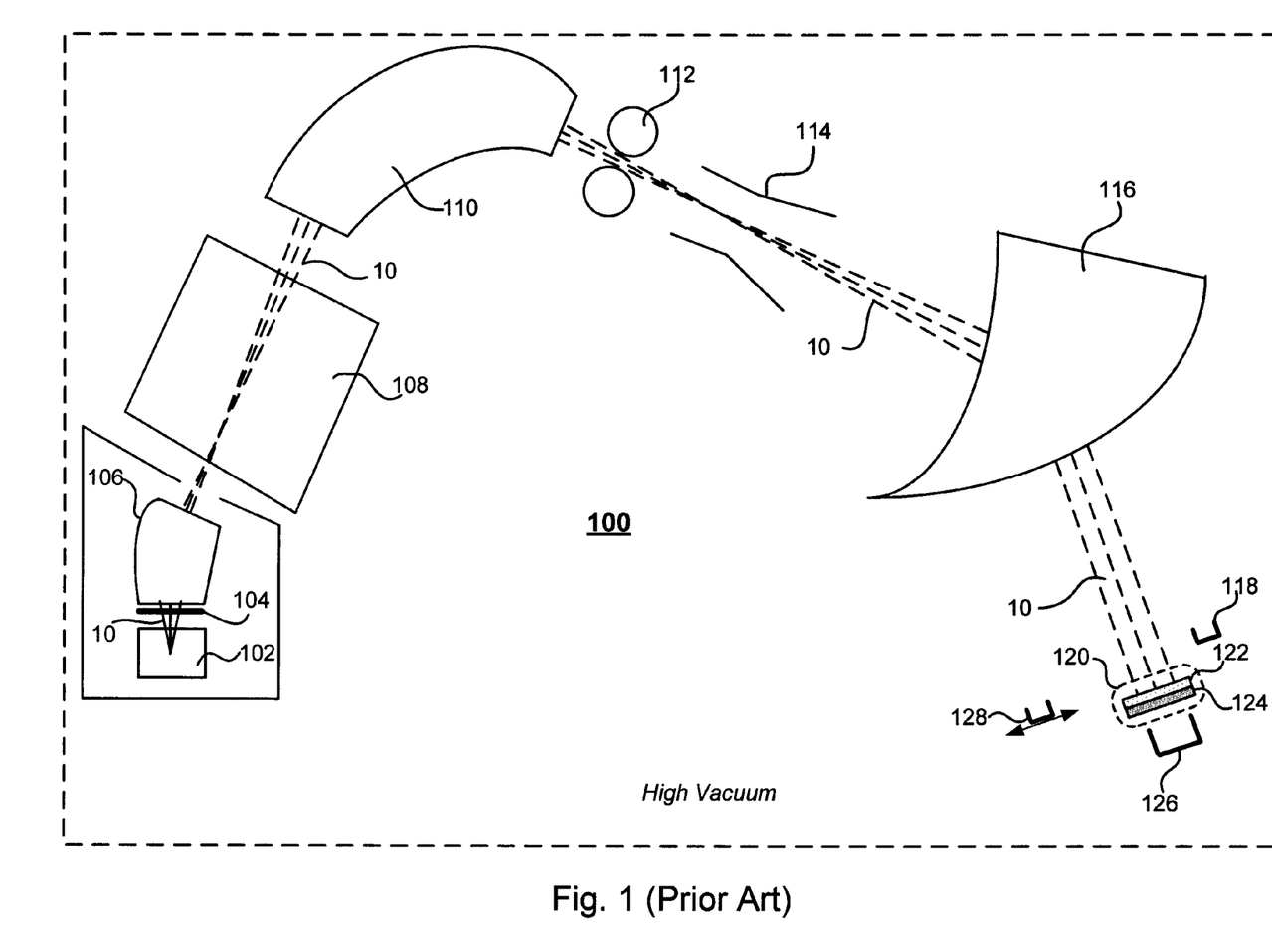
FIG. 1 depicts a conventional ion implanter system.

FIG. 1 depicts a prior art ion implanter system 100. As is typical for most ion implanter systems, the system 100 is housed in a high-vacuum environment. The ion implanter system 100 may comprise an ion source 102 and a complex series of components through which an ion beam 10 passes. The series of components may include, for example, an extraction manipulator 104, a filter magnet 106, an acceleration or deceleration column 108, an analyzer magnet 110, a rotating mass slit 112, a scanner 114, and a corrector magnet 116. Much like a series of optical lenses that manipulate a light beam, the ion implanter components can filter and focus the ion beam 10 before steering it towards an end station 120.

The end station 120 supports one or more workpieces, such as workpiece 122, in the path of ion beam 10 such that ions of the desired species are implanted into the workpiece 122. The workpiece 122 may be, for example, a semiconductor wafer or other similar target object requiring ion implantation. The end station 120 may also include a platen 124 to support the workpiece 122. The platen 124 may secure the workpiece 122 using electrostatic forces or other similar forces. The end station 120 may also include a scanner (not illustrated) for moving the workpiece 122 in a desired direction. The end station 120 may also include additional components, such as automated workpiece handling elements for introducing a workpiece 122 into the ion implanter system 100 and for removing the workpiece 122 after ion implantation. The ion implanter system 100 may also include a controller (not illustrated) to control a variety of subsystems and components of the ion implanter system 100. The ion implanter system 100 may also include a number of measurement devices, such as a dose control Faraday cup 118, a traveling Faraday cup 128, and a setup Faraday cup 126. These devices may be used to monitor and control the ion beam conditions. It should be appreciated by those skilled in the art that the entire path traversed by the ion beam 10 is evacuated during ion implantation.

The ion source 102 is a critical component of the ion implanter system 100. The ion source 102 is required to generate a stable, well-defined ion beam 10 for a variety of different ion species and extraction voltages. It is therefore desirable to operate the ion source 102 for extended periods of time without the need for maintenance or repair. Hence, the lifetime of the ion source 102 or mean time between failures (MTBF) is one performance criteria of the ion source 102.

Figure 2:
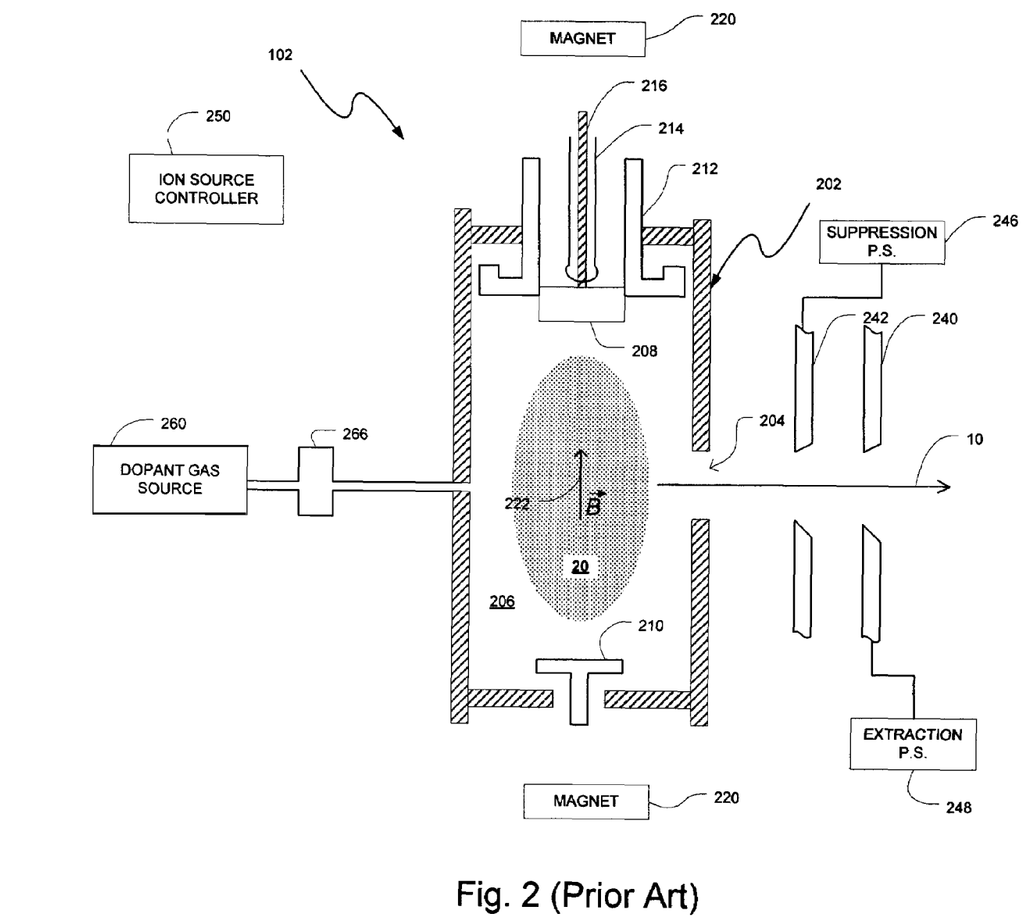
FIG. 2 depicts a conventional ion source in a conventional ion implanter system.

FIG. 2 depicts a typical embodiment of the ion source 102 in the ion implanter system 100. The ion source 102 may be an inductively heated cathode (IHC) ion source, which is typically used in high current ion implantation equipment. Other various ion sources may also be utilized. The ion source 102 includes an arc chamber housing 202 defining an arc chamber 206. The arc chamber housing 202 also includes an extraction aperture 204 for the ion beam 10. A cathode 208 and a repeller electrode 210 (or anticathode) may be positioned within the arc chamber 206. The repeller electrode 210 may be electrically isolated. A cathode insulator 212 may be positioned relative to the cathode 208 to electrically and thermally insulate the cathode 208 from the arc chamber housing 202. The cathode 208 may also be separated from the insulator 212 by a vacuum gap to control thermal conduction. A filament 214 may be positioned outside the arc chamber 206 and in close proximity to the cathode 208 to heat the cathode 208. A support rod 216 may support the cathode 208 and the filament 214. One or more source magnets 220 may also be provided to produce a magnetic field B within the arc chamber 206 in a direction toward the cathode 208 (see arrow 222 of FIG. 2).

An extraction electrode configuration, such as a ground electrode 240 and a suppression electrode 242, may be positioned in front of the extraction aperture 204. Each of the ground electrode 240 and the suppression electrode 242 have an aperture aligned with the extraction aperture 204 for extraction of the well-defined ion beam 10 from the arc chamber 206 for use in the ion implanter system 100.

An extraction power supply 248 may provide an extraction voltage to the ground electrode 240 for extraction of the ion beam 10 from the arc chamber 206. The extraction voltage may be adjusted according to the desired energy of the ion beam 10. A suppression power supply 246 may bias the suppression electrode 242 to inhibit movement of electrons within the ion beam 10. One or more additional power supplies may also be provided to the ion implanter system 100, such as a filament power supply or an arc power supply. A filament power supply (not illustrated) may provide current to the filament 214 for heating thereof, which in turn generates electrons that are accelerated toward the cathode 208 for heating the cathode 208. An arc power supply (not illustrated) may be coupled to the arc chamber housing 202 to accelerate electrons emitted by the cathode 208 into a plasma 20 formed within the arc chamber 206.

An ion source controller 250 provides control of the ion source 102. For example, the ion source controller 250 may control various power supplies of the ion source and/or may also control the flow rate of dopant gas from a dopant gas source 260 into the arc chamber 206. The ion source controller 250 may be a programmed controller or a dedicated special purpose controller. In one embodiment, the ion source controller 250 is incorporated into a main control computer of the ion implanter system 100.

A dopant gas source 260 may inject a predetermined amount of dopant gas into the arc chamber 206 via a gas flow controller 266. The dopant gas source 260 may provide a particular dopant gas containing a desired dopant element. For example, the dopant element may include boron (B), germanium (Ge), phosphorus (P), or silicon (Si) and may be provided as a fluorine-containing gas, such as boron trifluoride ($BF_3$), germanium tetrafluoride ($GeF_4$), phosphorous trifluoride ($PF_3$), or silicon tetrafluoride ($SiF_4$). Other various dopant gases and/or dopant elements may also be utilized, such as inert gases, including argon (Ar), xenon (Xe), etc.

A common cause of ion source failure is that some materials accumulate on cathode surfaces during extended ion implantation processes. The accumulated materials tend to reduce a thermionic emission rate of source ions from cathode surfaces. Consequently, desired arc currents cannot be obtained and the ion source 102 may have to be replaced in order to maintain normal ion source operation. As a result, performance degradation and short lifetime of the ion source 102 greatly reduces the productivity of the ion implanter system 100.

The above-described problems are especially significant for, but are not limited to, germanium ion implantation. Germanium ion implantation has been widely used in the semiconductor industry to pre-amorphize silicon wafers in order to prevent channeling effects. The demand for pre-amorphizing germanium ion implantation is expected to increase greatly in future semiconductor device manufacturing. One of the most popular source gases for germanium ion beams is germanium tetrafluoride ($GeF_4$) due to its stable chemical properties and cost-effectiveness. However, very short lifetimes of ion sources have been observed while operating with $GeF_4$ dopant gas.

The short lifetime of an ion source used in germanium ion implantation may be attributed to the presence of excessive, free fluorine atoms in the arc chamber 206 as a result of chemical dissociation of $GeF_4$ molecules. Specifically, arc chamber housing 202 material may be etched away due to chemical reactions with these free fluorine atoms. The arc chamber housing 202 material may eventually be deposited on a surface of the cathode 208, resulting in the degradation of electron emissions from the surface of the cathode 208.

It should be appreciated that while problems with germanium ion implantation are discussed above, other fluorine-containing dopant gases, such as boron trifluoride ($BF_3$), phosphorous trifluoride ($PF_3$), and silicon tetrafluoride ($SiF_4$), may exhibit similar problems that adversely affect performance and lifetime of the ion source 102 as a result of such materials deposited on the cathode 208. Although an inert gas, such as argon, xenon, etc., may be used as a dopant gas, using inert gases, even though they do not contain fluorine, inevitably result in reduced beam currents. As a result, ion source performance and lifetime is still greatly reduced.

Another common cause of ion source failure is caused by stripping (or sputtering) of cathode material. For example, metallic material (e.g., tungsten (W), molybdenum (Mo), etc.) from the cathode 208 is inclined to react with ions from plasma 20 in the arc chamber 206 accelerating towards the cathode 208. Because sputtering is dominated by the heaviest ion in the plasma 20, as ion mass increases, the sputtering effect may worsen. In fact, continued sputtering of material "thins" the cathode 208 and may eventually lead to an aperture or opening within the cathode 208. Consequently, performance and lifetime of the ion source 102 are greatly reduced when utilizing a dopant gas containing a heavy element, such as germanium (Ge), arsenic (As), xenon (Xe), etc., as opposed to lighter elements, such as boron (B) or carbon (C). These adverse effects are particularly noticeable when using hydrides (e.g., $AsH_3$, $PH_3$, $CH_4$, etc.), inert gases (Ar, Xe, etc.), or a mixture thereof, as the source of desired implantation species.

In view of the foregoing, it would be desirable to provide a technique for improving the performance and extending the lifetime of an ion source to overcome the above-described inadequacies and shortcomings.

SUMMARY OF THE DISCLOSURE

A technique for improving the performance and extending the lifetime of an ion source with gas dilution is disclosed. In one particular exemplary embodiment, the technique may be realized as a method for improving performance and lifetime of an ion source in an ion implanter with gas dilution. The method may comprise releasing a predetermined amount of dopant gas into an ion source chamber, and releasing a predetermined amount of dilutant gas into the ion source chamber. The dilutant gas may comprise a mixture of a xenon-containing gas and a hydrogen-containing gas for diluting the dopant gas to improve the performance and extend the lifetime of the ion source.

In accordance with other aspects of this particular exemplary embodiment, the dopant gas may be a fluorine-containing gas or a halogen-containing gas.

In accordance with further aspects of this particular exemplary embodiment, the mixture of the xenon-containing gas and the hydrogen-containing gas may be pre-mixed in a conduit before entry into the ion source chamber.

In accordance with additional aspects of this particular exemplary embodiment, the mixture of the xenon-containing gas and the hydrogen-containing gas may be pre-mixed in a dilutant gas source before entry into the ion source chamber.

In accordance with further aspects of this particular exemplary embodiment, the mixture of the xenon-containing gas and the hydrogen-containing gas may be mixed in the ion source chamber.

In accordance with additional aspects of this particular exemplary embodiment, the mixture of the xenon-containing gas and the hydrogen-containing gas may comprise approximately 70% xenon and approximately 30% hydrogen.

In accordance with further aspects of this particular exemplary embodiment, the dilutant gas comprises approximately 10% to 40% of a total gas in the ion source chamber.

In accordance with additional aspects of this particular exemplary embodiment, the dilutant gas comprises approximately 20% of the total gas in the ion source chamber and the dopant gas comprises approximately 80% of the total gas in the ion source chamber.

In accordance with another exemplary embodiment, the technique may be realized as an apparatus for improving performance and extending lifetime of an ion source in an ion implanter. The apparatus may comprise a dopant gas controller for releasing a predetermined amount of dopant gas from a dopant gas source into an ion source chamber and a first dilutant gas controller for releasing a predetermined amount of a first dilutant gas from a first dilutant gas source into the ion source chamber. The first dilutant gas may comprise a mixture of a xenon-containing gas and a hydrogen-containing gas for diluting the dopant gas to improve the performance and extend the lifetime of the ion source.

In accordance with another exemplary embodiment, the technique may be realized an apparatus for improving performance and extending lifetime of an ion source in an ion implanter. The apparatus may comprise a dopant gas controller for releasing a predetermined amount of dopant gas from a dopant gas source into an ion source chamber, a first dilutant gas controller for releasing a predetermined amount of a first dilutant gas from a first dilutant gas source into the ion source chamber, and a second dilutant gas controller for releasing a predetermined amount of a second dilutant gas from a second dilutant gas source into the ion source chamber. The first dilutant gas may be comprise a xenon-containing gas and the second dilutant gas may comprise a hydrogen-containing gas for diluting the dopant gas to improve the performance and extend the lifetime of the ion source.

In accordance with another exemplary embodiment, the technique may be realized a system for improving performance and extending lifetime of an ion source in an ion implanter. The system may comprise an ion source comprising a dopant gas controller, one or more dilutant gas controllers, and an ion source chamber. The dopant gas controller may release a predetermined amount of dopant gas from a dopant gas source into the ion source chamber. The one or more dilutant gas controllers may release a predetermined amount of dilutant gas from one or more dilutant gas sources into the ion source chamber. The dilutant gas may comprise at least a xenon-containing gas and a hydrogen-containing gas for diluting the dopant gas to improve the performance and extend the lifetime of the ion source.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENTS

Embodiments of the present disclosure improve the performance and extend the lifetime of an ion source with gas dilution.

Figure 3A:
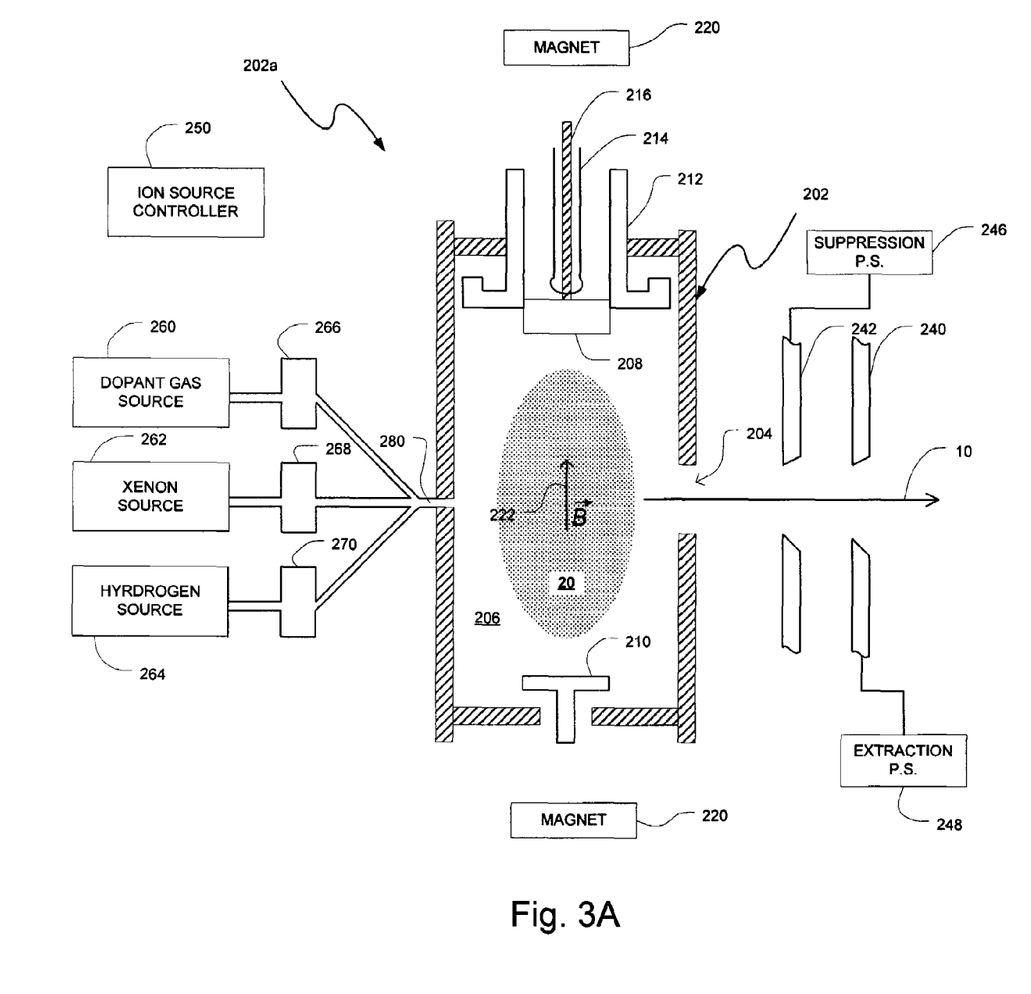
FIG. 3A depicts an exemplary ion source configuration in accordance with an embodiment of the present disclosure.
Figure 3B:
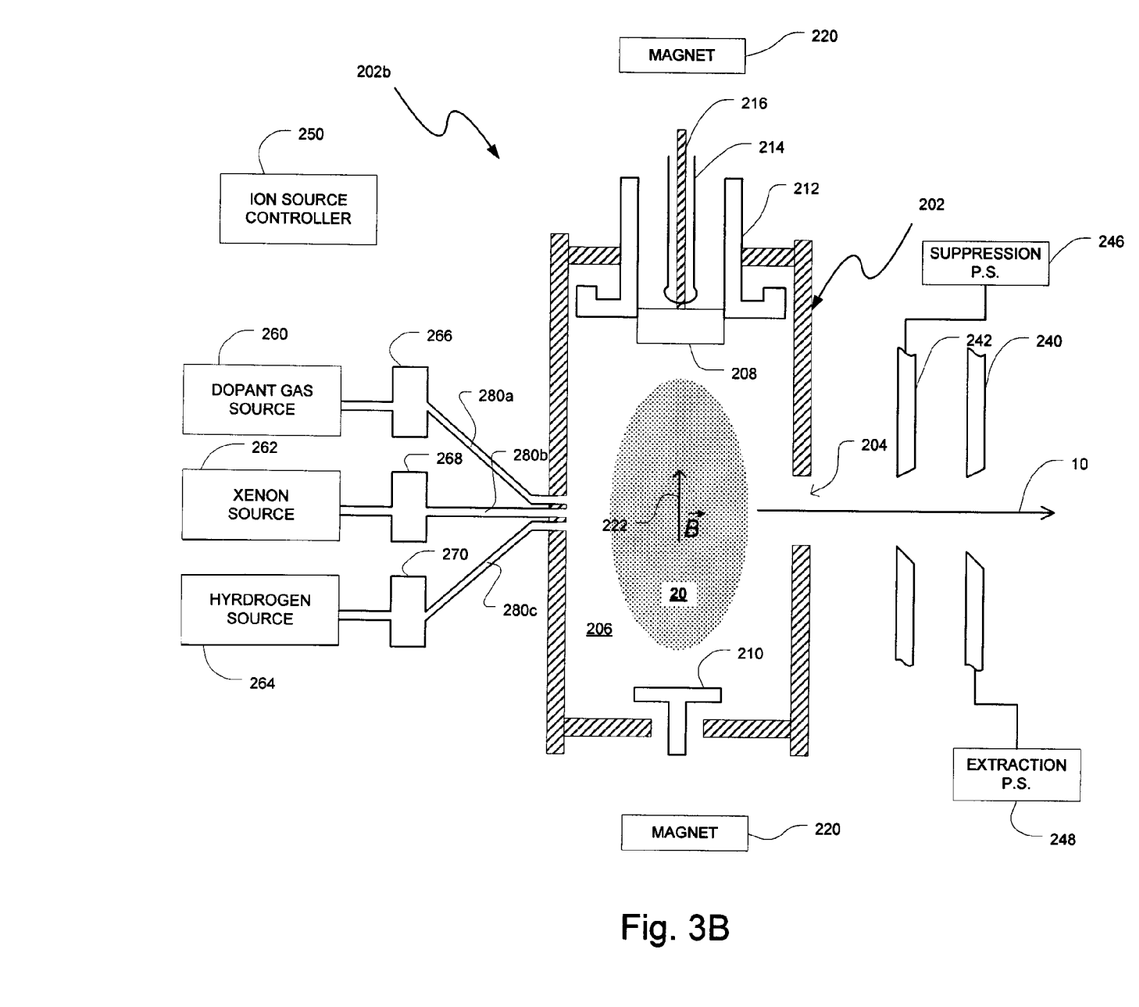
FIG. 3B depicts an exemplary ion source configuration in accordance with an embodiment of the present disclosure.
Figure 3C:
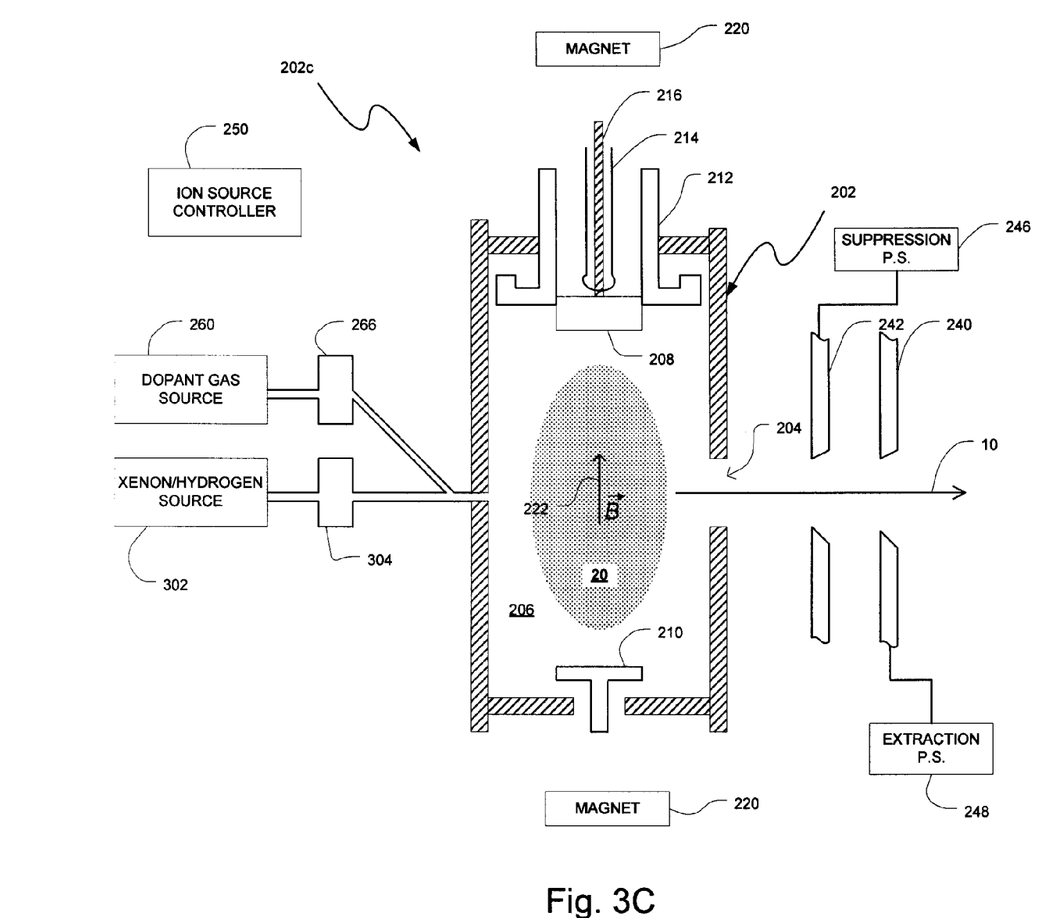
FIG. 3C depicts an exemplary ion source configuration in accordance with an embodiment of the present disclosure.

FIGS. 3A-3C depict exemplary ion source configurations 202a-202c in accordance with embodiments of the present disclosure. It should be appreciated by one skilled in the art that all of the elements of FIG. 2 are incorporated into FIGS. 3A-3C. As a result, all of the elements in FIGS. 3A-3C should be understood in relation to the elements in FIG. 2.

Referring to FIG. 3A, an ion source 202a may comprise one or more dilutant gas sources to release one or more dilutant gases into the arc chamber 206 to dilute a dopant gas from the dopant gas source 260. For example, a xenon gas source 262 and an associated gas flow controller 268 may provide a predetermined amount of xenon to the arc chamber 206 via a conduit 280 to dilute a dopant gas from the dopant gas source 260, while a hydrogen gas source 264 and an associated gas flow controller 270 may provide a predetermined amount of hydrogen to the arc chamber 206 via the same conduit 280 together with xenon to dilute a dopant gas from the dopant gas source 260. The dopant gas may include a fluorine-containing gas, such as boron trifluoride ($BF_3$), germanium tetrafluoride ($GeF_4$), silicon tetrafluoride ($SiF_4$), etc. The dopant gas may also include a halogen-containing gas, such as argon (Ar), xenon (Xe), etc. Other combinations and various dopants gases may also be considered. For example, the dilutant gas may comprise at least one of argon (Ar) or argon-containing gas, xenon (Xe) or a xenon-containing gas, hydrogen ($H_2$) or a hydrogen-containing gas, fluorine (F) or a fluorine-containing gas, or a combination thereof. Other combinations and various dilutant gases may also be utilized.

In one embodiment, as depicted in FIG. 3A, the dopant gas and the one or more dilutant gases may be provided via the same conduit 280 into the arc chamber 206. Thus, the one or more dilutant gases may be pre-mixed in the conduit 280 before entering the arc chamber 206. In another embodiment, as depicted in FIG. 3B, the dopant gas and the one or more dilutant gases in ion source 202b may be provided via different conduits 280a, 280b, 280c into the arc chamber 206. In such a case, the one or more dilutant gases are mixed in the arc chamber 206.

Referring back to FIG. 3A, when the filament 214 is heated by an associated power supply to thermionic emission temperatures, electrons from the filament 214 bombard the cathode 208 to thereby also heat the cathode 208 to thermionic emission temperatures. Electrons emitted by the cathode 208 are accelerated and ionize gas molecules of the dopant gas provided by the dopant gas source 260 within the arc chamber 206 to produce the plasma 20. The electrons within the arc chamber 206 may follow spiral trajectories of the magnetic field B 222 to increase the number of ionizing collisions. The repeller electrode 210 builds up a negative charge to repel electrons back through the arc chamber 206 producing additional ionizing collisions. The lifetime of the ion source 202a when operating with fluorine-containing dopant gases, such as $BF_3$, $GeF_4$, $PF_3$, and $SiF_4$, may be limited by metallic growth (e.g., tungsten (W) deposits) on arc chamber components exposed to the plasma 20. These components may include the cathode 208 and the repeller 210. Specifically, sputtered or vaporized tungsten, for example, may combine with fluorine to form $WF_6$, which stays in a gas form unless exposed to a temperature higher than the arc chamber housing walls and a temperature lower than the extraction aperture 204, cathode 208, and repeller 210. As a result, $WF_6$ molecules decomposing on the hottest surfaces may lead to tungsten buildup on such surfaces. Thus, by releasing a predetermined amount of one or more dilutant gases, such as xenon and hydrogen, along with a predetermined amount of dopant gas into the arc chamber 206, the rate of metallic growth or tungsten build-up may be diminished.

For example, xenon gas may strip (or sputter) the tungsten buildup on arc chamber components exposed to the plasma 20, such as the cathode 208 and repeller 210. Additionally, hydrogen gas may scavenge excessive, free fluorine molecules in the arc chamber 206 to reduce the formation of $WF_6$.

As a result, the combination of xenon and hydrogen dilutant gases may together contribute to improving performance and lifetime of ion sources. In one embodiment, a predetermined ratio of xenon to hydrogen released into the arc chamber 206 may include approximately 70% to 30%. Other various ratios may also be provided. In another embodiment, the one or more dilutant gases may include approximately 10% to 40% of the total gas in the arc chamber 206. In yet another embodiment, the one or more dilutant gases may include approximately 20% of the total gas and the dopant gas may be approximately 80%.

It should be appreciated by one skilled in the art that the one or more dilutant gases may also reduce tungsten buildup when the dopant gas is a halogen-containing rather than a fluorine-containing dopant gas. Accordingly, adding the one or more dilutant gases to dilute halogen-containing gases may also lead to improved performance and longer lifetime for ion sources.

It should also be appreciated by one skilled in the art that the one or more dilutant gases may also include argon (Ar). Although not quite as efficient as xenon, argon may also effectively strip (or sputter) the cathode 208 and repeller 210 (even though argon dilution may require more dilution than xenon) to improve the performance and extend the lifetime of ion sources.

FIG. 3C depicts an exemplary ion source configuration in accordance with an embodiment of the present disclosure. Unlike FIGS. 3A and 3B, where the one or more dilutant gases are released from separate dilutant gas sources (e.g., xenon gas source 262 and hydrogen gas source 264), FIG. 3C depicts an ion source 202c having one source 302 for the one or more dilutant gases. For example, the dilutant gas source 302 may already include a mixture of xenon and hydrogen as opposed to two or more separate sources 262, 264 depicted in FIGS. 3A and 3B. An associated gas flow controller 304 may control the flow of the pre-mixed xenon and hydrogen dilutant gases. In one embodiment, the dilutant gas source 302 may include the pre-mixed xenon and hydrogen at a predetermined ratio of approximately 70% xenon and 30% hydrogen. Other various ratios may also be considered. Of the total amount of gas from both the dopant gas source 260 and the xenon/hydrogen source 302, the xenon/hydrogen dilutant gas may comprise approximately 10% to 40% of the total gas in the arc chamber 206. In one embodiment, the xenon/hydrogen mixture may be approximately 20% of the total gas and the dopant gas may be approximately 80%.

It should be appreciated that while only two dilutant gases are described with reference to FIGS. 3A-3C, one of ordinary skill in the art would recognize that a greater number of dilutant gases, dilutant gas sources, and dilutant gas flow controllers may be implemented.

Figure 4:
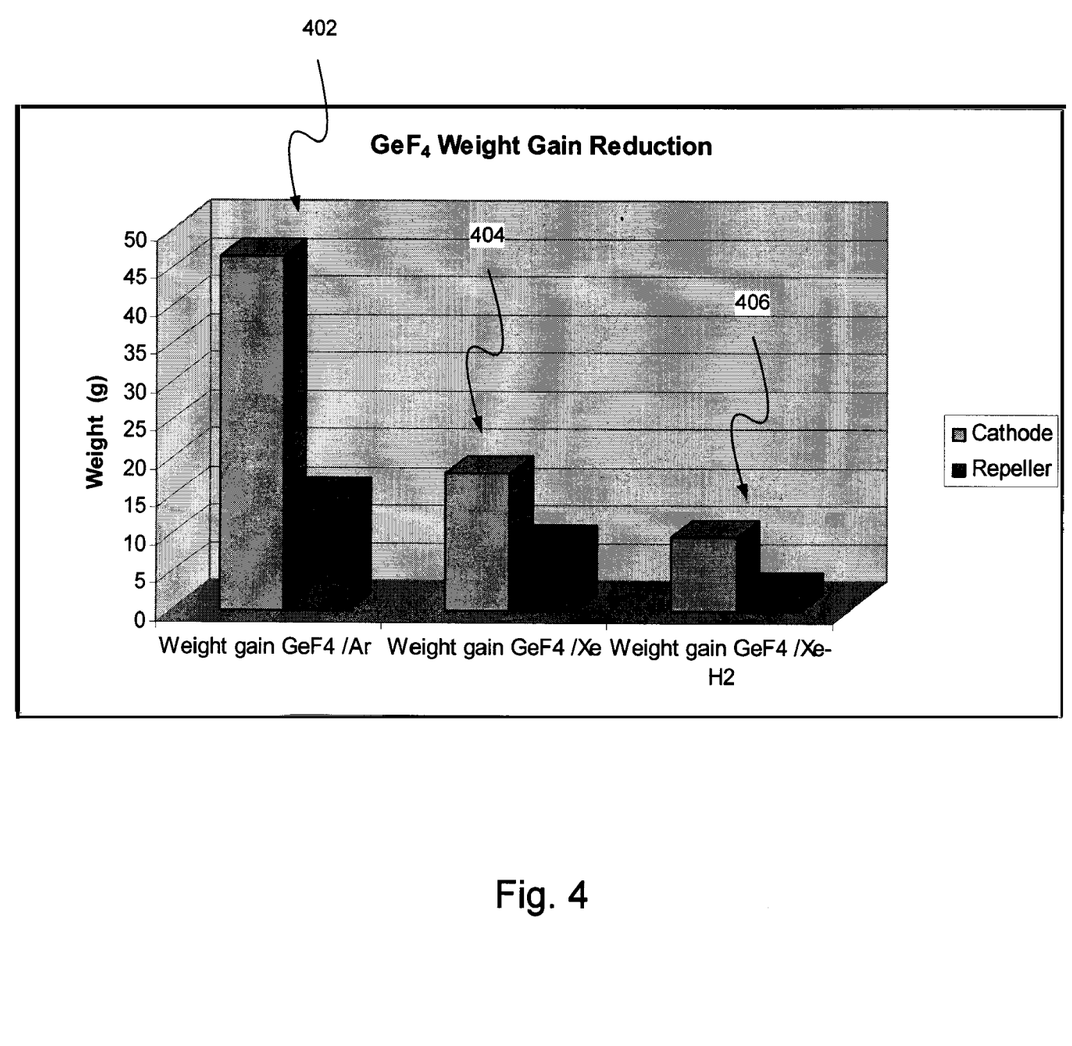
FIG. 4 depicts an exemplary illustrative graphical representation of deposit formation on components of an ion source with different dilution conditions in accordance with an embodiment of the present disclosure.

FIG. 4 depicts an exemplary illustrative graphical representation of deposit formation on components (e.g., the cathode 208 and repeller 210) of an ion source with different dilution conditions in accordance with an embodiment of the present disclosure.

The weight gain in grams (g) of the cathode 208 and the repeller 210 are graphed for three different conditions. The weight gain may be an indication of the amount of metallic deposits, such as tungsten deposits, that form on the cathode 208 and the repeller 210. A comparatively higher weight gain may directly correlate to a lower ion source lifetime and reduced ion performance.

For each of the three illustrated conditions, $GeF_4$ was the dopant gas. In the first condition 402, the dilutant gas used was argon. Over a predetermined period of time, the resulting weight gain for argon reached as high as 45 grams for the cathode 208 and almost 15 grams for the repeller 210. In the second condition 404, the dilutant gas used was xenon. Over a time period similar to the first condition 402, the weight gain for the second condition 404 was comparatively less than the first condition 402. The weight gain for the ion source components when using xenon as the dilutant gas reached approximately 22 grams for the cathode 208 and approximately 8 grams for the repeller 210. However, as illustrated in the third condition 406, when utilizing a combination of xenon and hydrogen gases as the one or more dilutant gases consistent with an embodiment of the disclosure and over a similar time period as that of the first and second conditions 402, 404, the weight gain of the cathode 208 was approximately 8 grams and the weight gain of the repeller 210 was approximately 2 grams. Accordingly, out of the three conditions illustrated in FIG. 4, the lowest weight gain was measured with the one or more dilutant gases comprising the xenon-hydrogen dilution gas mix.

Figure 5:
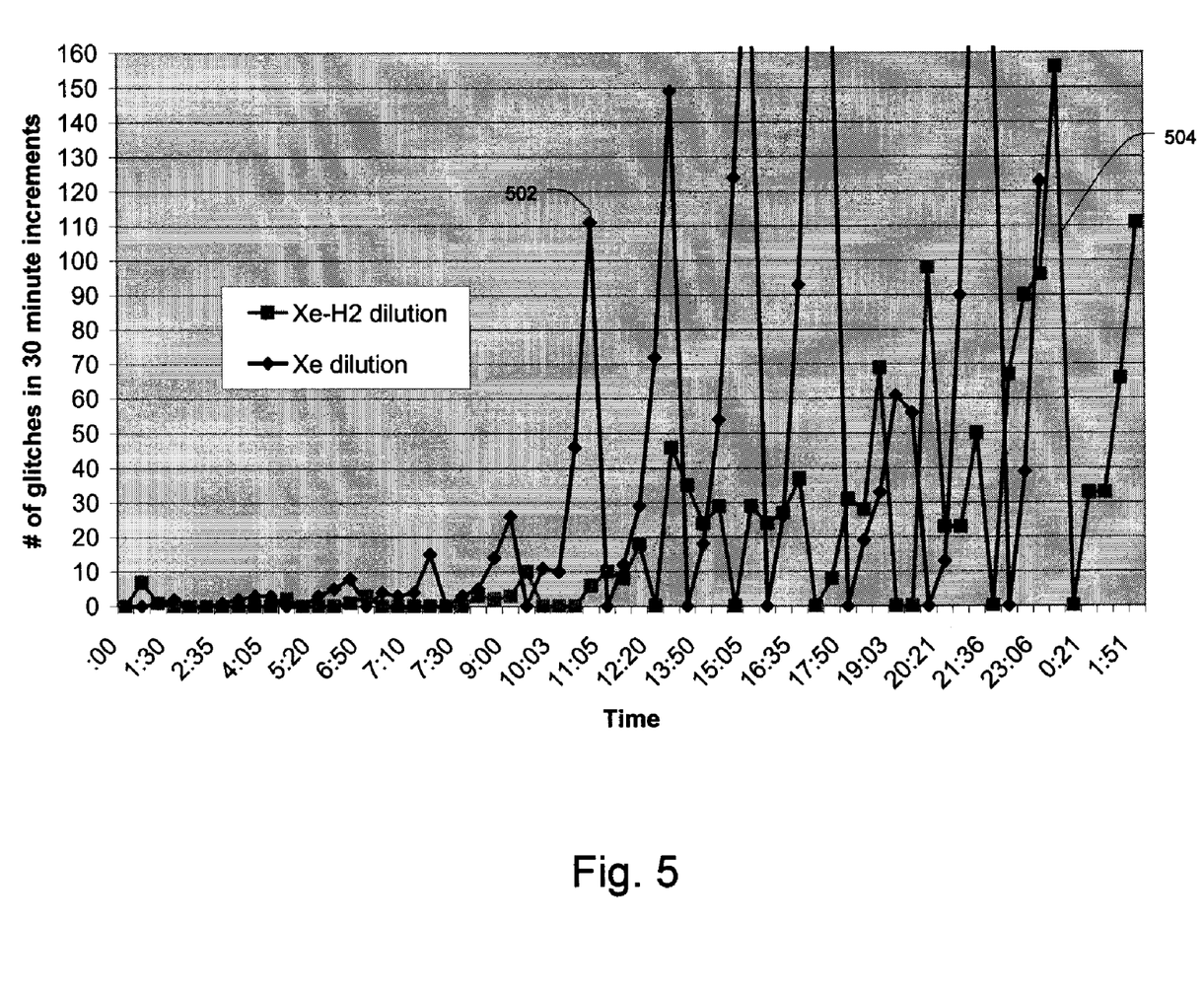
FIG. 5 depicts an exemplary illustrative graphical representation of the number of ion beam glitches under varying dilution conditions in accordance with an embodiment of the present disclosure.

FIG. 5 depicts an exemplary illustrative graphical representation of the number of ion beam "glitches" under varying dilution conditions in accordance with an embodiment of the present disclosure. An interruption in beam current of the ion beam 10 may be referred to as a "glitch." As a result, minimizing the glitch rate is desirable for increasing ion source performance and lifetime. Plot 502 charts the number of glitches when the one or more dilutant gases is xenon only in increments of approximately 30 minutes. Plot 504 charts the number of glitches when the one or more dilutant gases includes a xenon-hydrogen dilution mix consistent with an embodiment of the disclosure. In this graphical representation, the number of glitches for plot 504 having the xenon-hydrogen dilution mix is much lower than for plot 502 having xenon only dilution.

It should be appreciated that while embodiments of the present disclosure are directed to introducing one or more dilutant gases for improving performance and lifetime of ion sources in traditional ion implanter systems, other implementations may be provided as well. For example, a technique for introducing one or more dilutant gases may apply to plasma-based ion implantation systems, such as glow discharge plasma doping (GD-PLAD) or radio frequency plasma doping (RF-PLAD) systems. Other various implementations may also be provided.

In addition to improving performance and lifetime of ion sources in ion implanter systems, the presently disclosed technique for using one or more dilutant gases during ion implantation may have further advantages. For example, greater efficiency in the use of an ion source may be achieved because excessive time and costs due to ineffective, inefficient, and redundant steps associated with traditional ion implantation techniques may be reduced and/or eliminated using the improved dilutant gas technique of the present disclosure.

Thus, embodiments of the present disclosure may provide improved performance and extended lifetime of an ion source in ion implanter systems using gas dilution to expand the application traditional ion implantation methods and systems.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. A method for improving performance and extending lifetime of an ion source in an ion implanter, the method comprising:
   releasing a predetermined amount of dopant gas into an ion source chamber, wherein the dopant gas is a halogen-containing gas; and
   releasing a predetermined amount of dilutant gas into the ion source chamber, wherein the dilutant gas dilutes the dopant gas to improve the performance and extend the lifetime of the ion source, wherein the dilutant gas comprises a mixture of a xenon-containing gas and a hydrogen-containing gas.

2. The method of claim 1, wherein the dopant gas is a fluorine-containing gas.

3. The method of claim 1, wherein the mixture of the xenon-containing gas and the hydrogen-containing gas is premixed in a conduit before entry into the ion source chamber.

4. The method of claim 1, wherein the mixture of the xenon-containing gas and the hydrogen-containing gas is premixed in a dilutant gas source before entry into the ion source chamber.

5. The method of claim 1, wherein the mixture of the xenon-containing gas and the hydrogen-containing gas is mixed in the ion source chamber.

6. The method of claim 1, wherein the mixture of the xenon-containing gas and the hydrogen-containing gas comprises approximately 70% xenon and approximately 30% hydrogen.

7. The method of claim 1, wherein the dilutant gas comprises approximately 10% to 40% of a total gas in the ion source chamber.

8. The method of claim 7, wherein the dilutant gas comprises approximately 20% of the total gas in the ion source chamber and the dopant gas comprises approximately 80% of the total gas in the ion source chamber.

9. An apparatus for improving performance and extending lifetime of an ion source in an ion implanter, the apparatus comprising:
   a dopant gas controller for releasing a predetermined amount of dopant gas from a dopant gas source into an ion source chamber, wherein the dopant gas is a halogen-containing gas; and
   a first dilutant gas controller for releasing a predetermined amount of a first dilutant gas from a first dilutant gas source into the ion source chamber, wherein the first dilutant gas dilutes the dopant gas to improve the performance and extend the lifetime of the ion source and wherein the first dilutant gas comprises a mixture of a xenon-containing gas and a hydrogen-containing gas.

10. The apparatus of claim 9, wherein the dopant gas is a fluorine-containing gas.

11. The apparatus of claim 9, wherein the mixture of the xenon-containing gas and the hydrogen-containing gas is premixed in the dilutant gas source before entry into the ion source chamber.

12. The apparatus of claim 9, wherein the mixture of the xenon-containing gas and the hydrogen-containing gas comprises approximately 70% xenon and approximately 30% hydrogen.

13. The apparatus of claim 9, wherein the dilutant gas comprises approximately 10% to 40% of a total gas in the ion source chamber.

14. The apparatus of claim 13, wherein the dilutant gas comprises approximately 20% of the total gas in the ion source chamber and the dopant gas comprises approximately 80% of the total gas in the ion source chamber.

15. An apparatus for improving performance and extending lifetime of an ion source in an ion implanter, the apparatus comprising:
   a dopant gas controller for releasing a predetermined amount of dopant gas from a dopant gas source into an ion source chamber, wherein the dopant gas is a halogen-containing gas;
   a first dilutant gas controller for releasing a predetermined amount of a first dilutant gas from a first dilutant gas source into the ion source chamber, wherein the first dilutant gas dilutes the dopant gas to improve the performance and extend the lifetime of the ion source and wherein the first dilutant gas comprises a xenon-containing gas; and
   a second dilutant gas controller for releasing a predetermined amount of a second dilutant gas from a second dilutant gas source into the ion source chamber, wherein the second dilutant gas dilutes the dopant gas to improve the performance and extend the lifetime of the ion source and wherein the second dilutant gas comprises a hydrogen-containing gas.

16. The apparatus of claim 15, wherein the first dilutant gas and the second dilutant gas is premixed in a conduit before entry into the ion source chamber.

17. The apparatus of claim 15, wherein the first dilutant gas and the second dilutant gas is mixed in the ion source chamber.

18. The apparatus of claim 15, wherein the first dilutant gas and the second dilutant gas form a dilutant gas combination comprising approximately 70% xenon and approximately 30% hydrogen.

19. The apparatus of claim 18, wherein the dilutant gas combination comprises approximately 10% to 40% of a total gas in the ion source chamber.

20. The apparatus of claim 19, wherein the dilutant gas combination comprises approximately 20% of the total gas in the ion source chamber and the dopant gas comprises approximately 80% of the total gas in the ion source chamber.

21. A system for improving performance and extending lifetime of an ion source in an ion implanter, the system comprising:
   an ion source comprising a dopant gas controller, one or more dilutant gas controllers, and an ion source chamber;
   wherein the dopant gas controller releases a predetermined amount of dopant gas from a dopant gas source into the ion source chamber, the dopant gas source containing halogen containing gas;
   wherein the one or more dilutant gas controllers release a predetermined amount of dilutant gas from one or more dilutant gas sources into the ion source chamber; and
   wherein the dilutant gas comprises at least a xenon-containing gas and a hydrogen-containing gas to dilute the dopant gas to improve the performance and extend the lifetime of the ion source.

* * * * *